United States Patent
Ohnishi et al.

(10) Patent No.: US 6,566,956 B2
(45) Date of Patent: May 20, 2003

(54) HIGH FREQUENCY POWER AMPLIFIER

(75) Inventors: Masami Ohnishi, Hachiouji (JP); Akira Maeki, San Jose, CA (US)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/810,547

(22) Filed: Mar. 19, 2001

(65) Prior Publication Data

US 2002/0014920 A1 Feb. 7, 2002

(30) Foreign Application Priority Data

Jul. 14, 2000 (JP) ........................ 2000-218700

(51) Int. Cl.[7] .............................. H03F 3/68; H03F 3/60
(52) U.S. Cl. ..................... 330/295; 330/306; 330/286
(58) Field of Search ................. 330/286, 295, 330/302, 306, 54; 455/126

(56) References Cited

U.S. PATENT DOCUMENTS

| | | | | |
|---|---|---|---|---|
| 4,543,535 A | * | 9/1985 | Ayasli .................... | 330/286 |
| 5,028,879 A | * | 7/1991 | Kim ....................... | 330/286 |
| 5,227,734 A | * | 7/1993 | Schindler et al. ........ | 330/286 |
| 5,367,267 A | * | 11/1994 | Fuchs ..................... | 330/286 |
| 6,049,250 A | * | 4/2000 | Kintis et al. ............. | 330/286 |
| 6,236,272 B1 | * | 5/2001 | Takei et al. ............... | 330/286 |

OTHER PUBLICATIONS

The Institute of Electronics, Information and Communication Engineers, Digest of Electronics Society Meeting 1997, C–2–27, H. Uda et al, "Improved Cluster Matching in an L–I Power Amplifier Module", P. 62.

* cited by examiner

*Primary Examiner*—Robert Pascal
*Assistant Examiner*—Khanh Van Nguyen
(74) *Attorney, Agent, or Firm*—Antonelli, Terry, Stout, & Kraus, LLP (57) ABSTRACT

A high frequency power amplifier is provided that prevents loop oscillation at a low frequency caused by a closed loop formed between combined semiconductor devices. Previously, coupled-line directional couplers or capacitors for low frequency rejection have been used to prevent the closed loop from being formed. Also, a circuit including a resistance component required for attenuating self-oscillation has been provided. Therefore, to prevent both loop oscillation and self oscillation, two circuits have been required. Accordingly, a high frequency power amplifier is provided with a low frequency prevention circuit that attenuates the passing of each frequency of loop oscillation and self oscillation to each signal line divided by a power divider. Thus, the two circuits respectively required for preventing the loop oscillation and self oscillation of a travelling wave combine type amplifier can be formed by one low frequency prevention circuit.

16 Claims, 9 Drawing Sheets

HIGH FREQUENCY POWER AMPLIFIER

BACKGROUND OF THE INVENTION

The present invention relates to a high frequency power amplifier for a transmitter used for a mobile communication base station, particularly relates to a high frequency power amplifier provided with a circuit for preventing the loop oscillation and the self oscillation of a travelling wave combine type power amplifier.

Currently, tens to hundreds of watt average transmission power is required for the output of a transmission power amplifier used for a mobile communication base station so that one base station supports tens to hundreds of subscribers.

Also, to realize various communication service, a digital communication mode is mainstream. As a modulation mode in the case of a digital communication mode is phase/amplitude modulation, high linearity is required for a transmission power amplifier. To compensate nonlinearity of a semiconductor device for realizing a transmission power amplifier, hundreds of watt to several kilowatt saturation power which is equivalent to approximately ten times of average transmission power is required for the transmission power amplifier. Only a small quantity of power can be generally output by one semiconductor device used for a transmission power amplifier and for example, at the current technological level, saturation power in a band of 2 GHz is approximately 10 to 100 W. Therefore, in case a power amplifier is designed using a semiconductor device, plural semiconductor devices are required to be used and the output is required to be combined to output heavy power.

For a method of combining the power of a power combiner applied to such a power amplifier for a mobile communication base station, a Wilkinson type disclosed at 97' Electronics Society Meeting (C-2-27) held by The Instituted of Electronics, Information and Communication Engineers for example and a cluster type combine system which is its transformed type are known.

SUMMARY OF THE INVENTION

Figure 2:
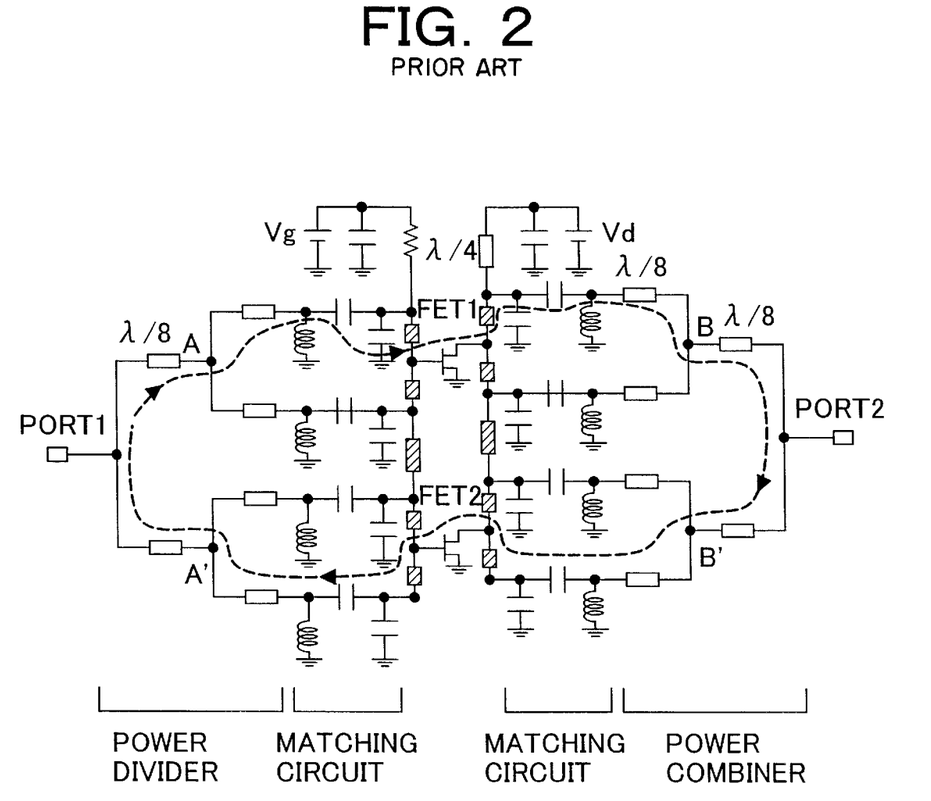
FIG. 2 is a block diagram showing a power combiner according to prior art.

FIG. 2 shows the circuit configuration described above which is marked with a broken line showing a closed loop corresponding to a loop oscillation at a low frequency studied as a problem by the present inventors. This circuit has the configuration that after a high frequency signal input from a port 1 is divided by a power divider, it is input to the gate of each semiconductor device via a matching circuit on the input side, after it is amplified, it is input to a combine circuit via a matching circuit on the output side, is combined again and is output from a port 2.

As shown in FIG. 2, in this conventional type combine system, a capacitor for cutting off a loop to prevent low frequency loop oscillation and a bias circuit which also functions as an oscillation prevention circuit for applying bias to each device for combining and preventing the self oscillation of each device are provided every semiconductor device.

Also, a line connecting each gate and each drain of two semiconductor devices FET1 and FET2 respectively in series is provided without supplying bias every semiconductor device, gate bias Vg is applied to a bias circuit on the input side in the upper left of FIG. 2 and drain bias Vd is applied to a bias circuit on the output side in the upper right.

However, in the configuration according to prior art, loop oscillation at a low frequency caused due to a closed loop is required to be prevented every combined semiconductor devices (or combined power amplifiers) Therefore, a coupled-line directional coupler is required to be used for a power combiner or a capacitor for low frequency rejection for preventing a closed loop from being formed is required to be inserted into each signal line. Therefore, for a countermeasure for the former, multiple λ/4 coupled lines are required to be provided, for a countermeasure for the latter, an individual bias circuit is required for each amplifier because direct current is cut off and both countermeasures have a problem that large area is occupied.

Also, as a semiconductor device causes self oscillation by impedance applied to input and output, a circuit for attenuating oscillation power such as including a resistance component in an oscillation frequency is required to be provided and there is a defect that a power efficiency is deteriorated.

In the case of bias construction in such an example of the conventional type, as bias Vg and Vd are supplied from either (the side of FET1 in FIG. 2) of FETs connected in series, there is also possibility that a phenomenon such as the balance of combination is broken in an amplitude-frequency band and the performance of the whole is deteriorated occurs. Also, in case plural similar amplifiers are further configured in parallel to increase power in addition to the configuration shown in FIG. 2, not only plural closed loops shown by a broken line in FIG. 2 are formed but a larger closed loop via an apart another semiconductor device is formed and a circuit to prevent these loop oscillation and self oscillation is required to be provided.

As described above, to prevent loop oscillation at a low frequency and the self oscillation of the semiconductor device, the two circuits are provided.

The object of the invention is to provide a compact high frequency power amplifier in which a circuit for preventing the loop oscillation of a travelling wave combine type high frequency amplifier and the self oscillation of each amplifier itself is provided.

To achieve the object, the high frequency power amplifier according to the invention is provided with a low frequency oscillation prevention circuit that attenuates each frequency of loop oscillation and self oscillation to a signal line on which a signal is divided by a power divider/combiner. As described above, heretofore, two circuits are required to prevent loop oscillation and self oscillation, however, as this low frequency oscillation prevention circuit can be composed of one circuit, it can be miniaturized.

Figure 5:
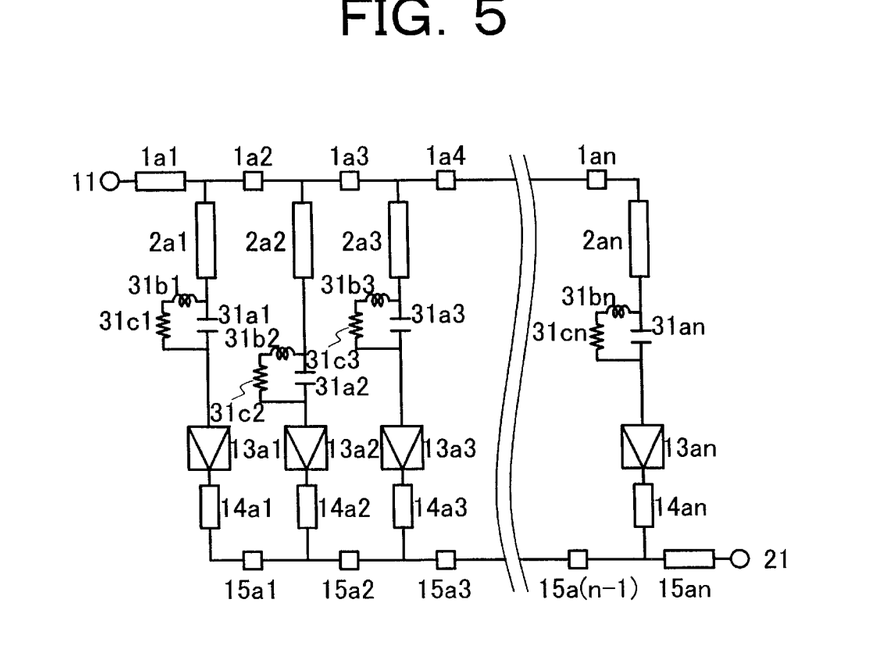
FIG. 5 is a block diagram showing further another embodiment of the travelling wave combine type high frequency power amplifier according to the invention.
Figure 6A:
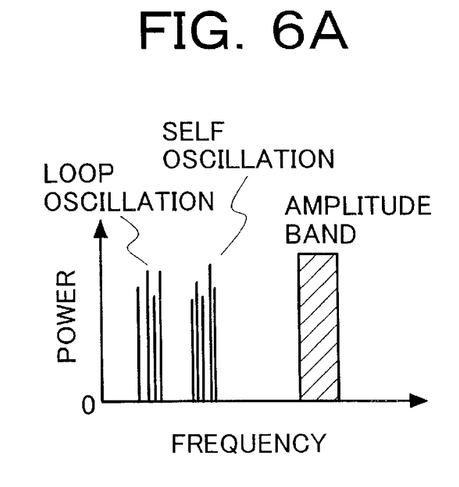
FIG. 6A shows the frequency characteristic of the passing signal power of a travelling wave combine type high frequency power amplifier in case the invention is not used and FIG. 6B is an explanatory drawing for explaining the characteristic of a low frequency rejection filer used in the high frequency power amplifier according to the invention.
Figure 6B:
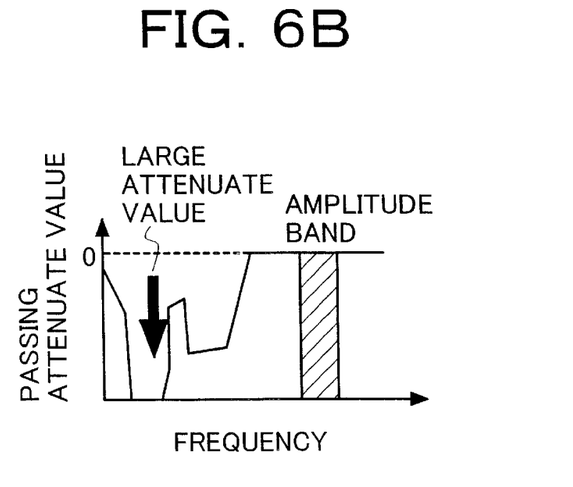

Referring to FIGS. 6A and 6B, the principle of the invention will be described below. FIG. 6A shows the frequency characteristic of the passing signal power of the travelling wave combine type high frequency power amplifier in case the invention is not used and FIG. 6B shows the frequency characteristic of a passing attenuate value in case low frequency oscillation prevention circuits equivalent to one embodiment described later of the invention and shown in FIG. 1, that is, low frequency rejection filters 3a1 to 3an are composed of capacitors 31a1 to 31an, inductors 31b1 to 31bn and resistors 31c1 to 31cn as shown in FIG. 5.

In the case of a travelling wave combine type high frequency power amplifier for which the invention is not used, as shown in FIG. 6A, for the frequency characteristic of passing signal power, two oscillation of loop oscillation by a closed loop and self oscillation by a semiconductor device itself are caused in a frequency band below an amplitude band. In these oscillation, oscillation signal power is hardly stable and often increases to the limit of a used semiconductor device, that is, until the semiconductor device is broken.

To prevent the two oscillation from being caused, parallel resonance is first caused by the capacitors 31a1 to 31an and the inductors 31b1 to 31bn. If a parallel resonance frequency at this time is designed so that it is a loop oscillation frequency lower than the amplitude band of the power amplifier, that is, each semiconductor device for power amplification, impedance becomes infinite in the loop oscillation frequency and the travelling wave combine type high frequency power amplifier has no closed loop. Therefore, no loop oscillation occurs.

Also, for the self oscillation of the semiconductor device, in a state in which no parallel resonance by the capacitors 31a1 to 31an and the inductors 31b1 to 31bn is caused, as the resistors 31c1 to 31cn respectively have a pure resistance value or a resistance value close to the pure resistance value to each semiconductor device, no self oscillation is caused. Hereby, it is known that at each frequency shown in FIG. 6B corresponding to a loop oscillation frequency and a self oscillation frequency respectively shown in FIG. 6A, a passing attenuate value increases and an attenuate characteristic having two troughs is formed. In the case of a filter having a normal high-pass filter characteristic that a frequency below an amplitude band is cut, that is, in case a self oscillation band is attenuated, the impedance of the filter becomes impedance along the extremely peripheral side as in a short state and an open state in Smith chart. This is an area in which a device often causes self oscillation and the filter is not effective to prevent self oscillation. Therefore, to prevent self oscillation, it is desirable that impedance on the input and output sides of the amplifier is designed so that it is impedance close to the center in Smith chart to offer the characteristic shown in FIG. 6B in which oscillation can be prevented.

The object and another object of the invention will be clear by the following detailed description and attached claims referring to attached drawings. In the attached drawings, the same reference number shows the same or the similar part.

DESCRIPTION OF THE PREFERRED EMBODIMENTS

First Embodiment

Figure 1:
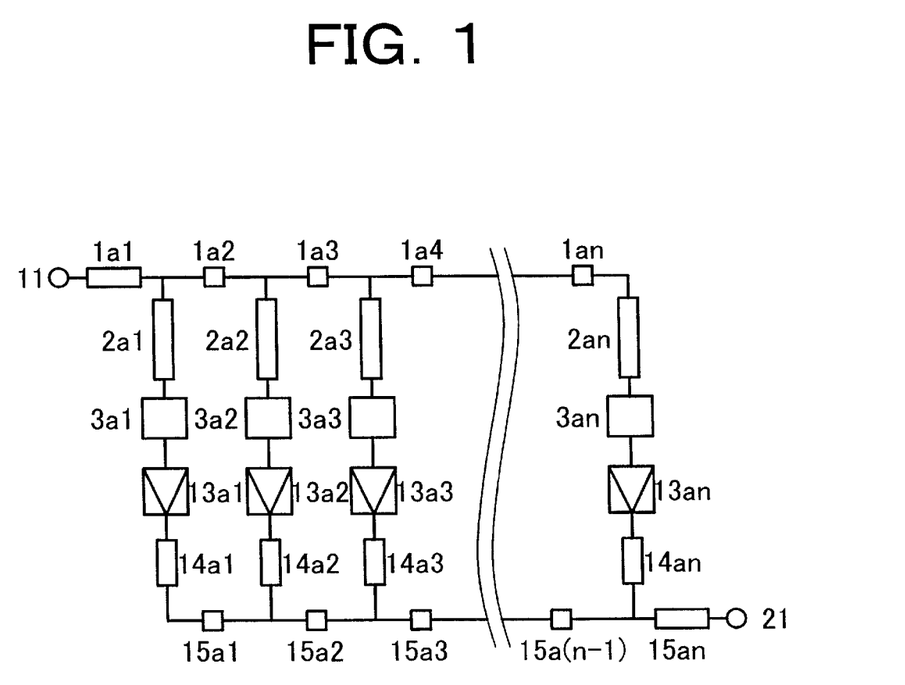
FIG. 1 is a block diagram showing one embodiment of a travelling wave combine type high frequency power amplifier according to the invention.

FIG. 1 is a block diagram showing the configuration of a high frequency power amplifier equivalent to one embodiment of the invention using a travelling wave combine type, that is, a travelling wave combine and divide circuit. The block diagram shows the embodiment in case n pieces (n: 2 or more natural number) of power amplifiers are included as a component and for a signal input to an input terminal 11, the first output of a first divide circuit composed of transmission lines 2a1 and 1a2 via an input transmission line 1a1 becomes an input signal to a power amplifier 13a1 via a first low frequency oscillation prevention circuit, that is, a low frequency rejection filter 3a1.

Further, the second output of the first divide circuit is input to a second divide circuit composed of transmission lines 2a2 and 1a3 and the first output of the second divide circuit becomes an input signal to a power amplifier 13a2 via a second low frequency rejection filter 3a2. Furthermore, the second output of the second divide circuit is input to a third divide circuit composed of transmission lines 2a3 and 1a4 and the first output of the third divide circuit becomes an input signal to a power amplifier 13a3 via a third low frequency rejection filter 3a3.

The similar operation is repeated, the first output of an (n−1)th divide circuit becomes an input signal to a power amplifier 13a(n−1) via an (n−1)th low frequency rejection filter 3a(n−1) and further, the second output of the (n−1)th divide circuit is input a power amplifier 13an via an 'n'th low frequency rejection filter 3an via transmission lines 1an and 2an.

Also, in a circuit on the output side, a signal output from the first power amplifier 13a1 becomes first input to a first combine circuit composed of 14a1, 15a1 and 14a2, and a signal output from the second power amplifier 13a2 becomes second input to the first combine circuit. The output of the first combine circuit becomes first input to a second combine circuit composed of 15a2 and 14a3, and a signal output from the third power amplifier 13a3 becomes second input to the second combine circuit. The output of the second combine circuit becomes first input to a third combine circuit composed of 15a3 and 14a4, and a signal output from a fourth power amplifier 13a4 becomes second input to the third combine circuit. The output of the third combine circuit becomes first input to a fourth combine circuit composed of 15a4 and 14a5, the similar operation is repeated, further, a signal output from an 'n'th power amplifier 13an becomes second input to an (n−1)th combine circuit, is transmitted to an output transmission line 15an and the other end of the output transmission line 15an is connected to an output terminal 21.

In FIG. 1, structure that the n pieces of low frequency rejection filters 3a1 to 3an for preventing loop oscillation and self oscillation are provided on the input side of each power amplifier 13a1 to 13an is shown, further, the sum of the electrical length of the transmission lines 1a2 to 1an for forming a travelling wave combine circuit is substantially equivalent to a wave length and the electrical length of each transmission line 1a2 to 1an is substantially equivalent to 1/n of the wavelength.

Each low frequency rejection filter has a characteristic that a passing attenuate value increases in each frequency domain of loop oscillation and self oscillation respectively lower than an amplitude band as shown in FIG. 6B. The characteristic is also similar in the following embodiments.

This embodiment has the effect that as loop oscillation and self oscillation can be prevented by the low frequency rejection filters 3a1 to 3an, the breakdown of the semiconductor device by the oscillation is prevented.

Second Embodiment

Figure 3:
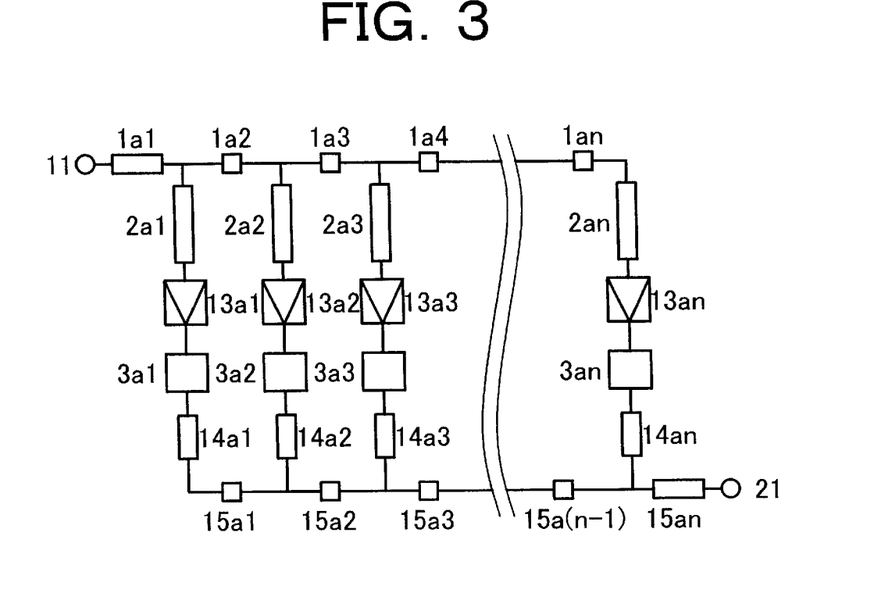
FIG. 3 is a block diagram showing another embodiment of the travelling wave combine type high frequency power amplifier according to the invention.

FIG. 3 is a block diagram showing the configuration of a travelling wave combine type high frequency power amplifier equivalent to another embodiment of the invention. This embodiment is different from the first embodiment in that in this embodiment, the low frequency rejection filters 3a1 to 3an shown in FIG. 1 are provided on the output side of each power amplifier 13a1 to 13an.

This embodiment also has the effect that as loop oscillation can be prevented by low frequency rejection filters 3a1 to 3an, the breakdown of the semiconductor device by the oscillation is prevented as in the first embodiment.

Third Embodiment

Figure 4:
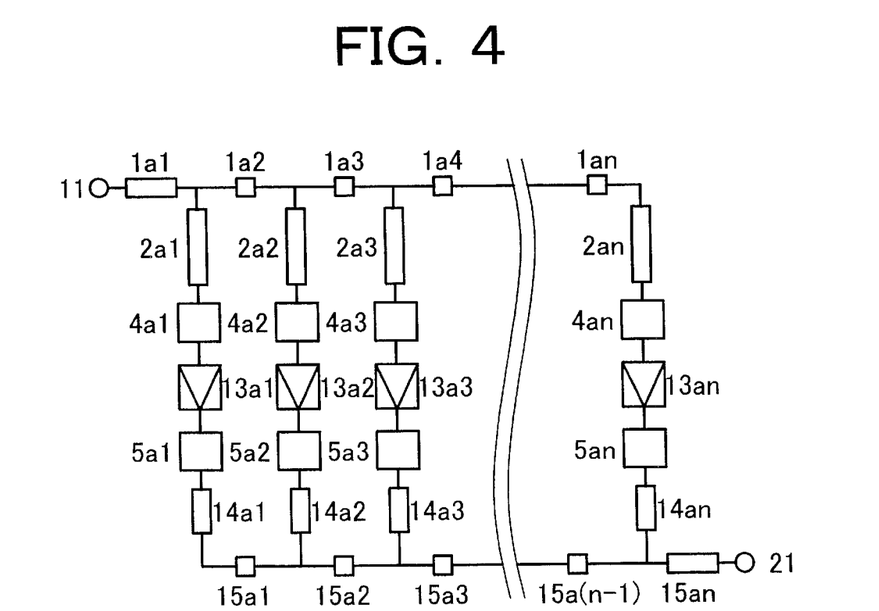
FIG. 4 is a block diagram showing further another embodiment of the travelling wave combine type high frequency power amplifier according to the invention.

FIG. 4 is a block diagram showing the configuration of a travelling wave combine type high frequency power amplifier equivalent to another embodiment of the invention. This embodiment is different from the above embodiments in that the low frequency rejection filters 3a1 to 3an shown in FIGS. 1 and 3 are provided both on the input side and on the output side of each power amplifier 13a1 to 13an, that is, low frequency rejection filters on the input side 4a1 to 4an and low frequency rejection filters on the output side 5a1 to 5an are provided.

According to this embodiment, loop oscillation and self oscillation can be prevented by the low frequency rejection filters on the input side 4a1 to 4an and the low frequency rejection filters on the output side 5a1 to 5an. Therefore, this embodiment has the effect that the breakdown of the semiconductor device by the oscillation is prevented.

This embodiment has an advantage that as self oscillation and loop oscillation are respectively prevented on the input side and on the output side by providing the low frequency rejection filters both on the input side and on the output side, the oscillation can be more securely prevented, compared with the embodiments shown in FIGS. 1 and 3.

Fourth Embodiment

FIG. 5 is a block diagram showing the configuration of a travelling wave combine type high frequency power amplifier equivalent to another embodiment of the invention. This embodiment is different from the above embodiments in that in this embodiment, the low frequency rejection filters 3a1 to 3an shown in FIG. 1 are composed of capacitors 31a1 to 31an, inductors 31b1 to 31bn and resistors 31c1 to 31cn.

According to this embodiment, loop oscillation can be prevented by the parallel resonance of the capacitors 31a1 to 31an and the inductors 31b1 to 31bn and self oscillation can be prevented by the resistors 31c1 to 31cn. That is, a parallel resonance frequency is set so that it is a loop oscillation frequency and as only the resistors 31c1 to 31cn are recognized from the semiconductor device in a state in which no parallel resonance is required outside an amplitude band, self oscillation can be prevented from being caused. Therefore, this embodiment has the effect that the breakdown of the semiconductor device by the oscillation is prevented by the configuration in this embodiment.

Figure 12:
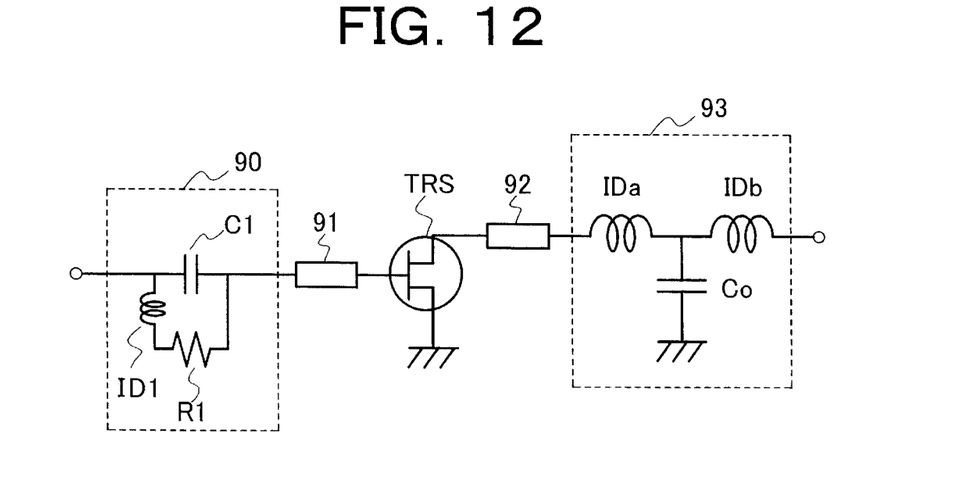
FIG. 12 is a circuit diagram showing a case that the low frequency rejection filter functions as an input matching circuit.

Also, the low frequency rejection filter can also function as the internal matching circuit of the device. That is, the capacitor in the low frequency rejection filter can also function as a capacitor of the internal matching circuit. As shown in FIG. 12, an input matching circuit inside the device is composed of an inductor (or a microstripline) 91 and a capacitor C1 in a low frequency rejection filter 90 and the capacitor C1 is set to a capacitance value at which input is matched. The input matching circuit has only to be set so that parallel resonance occurs at a loop oscillation frequency by the capacitor C1 set to this value and the inductor ID1

For example, in a band of 1.5 GHz used for a mobile telephone and others, a value of a capacitor the input impedance of which is 50 Ω for input matching is normally approximately several pF to several tens pF. Therefore, in case the capacitor C1 is set to 10 pF for input matching, parallel resonance at a frequency of 500 MHz or less at which loop oscillation and self oscillation occur is enabled by the inductor ID1 of approximately 10 nH. In FIG. 12, a reference number 92 denotes an inductor (or a microstripline), TRS denotes a semiconductor transistor and 93 denotes an output matching circuit composed of inductors IDa and IDb and a capacitor Co. Needless to say, the configuration of the output matching circuit is equalized to that of the input matching circuit, a low frequency rejection filter is also provided on the output side and may also function as the capacitor of the output matching circuit as on the input side.

Fifth Embodiment

Figure 7:
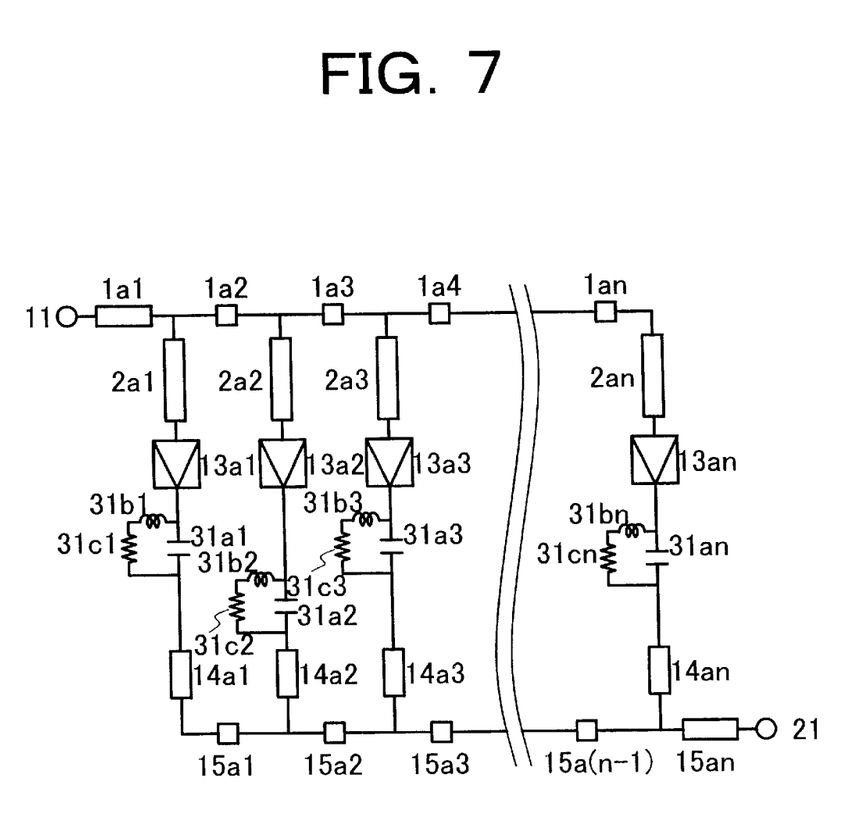
FIG. 7 is a block diagram showing further another embodiment of the travelling wave combine type high frequency power amplifier according to the invention.

FIG. 7 is a block diagram showing the configuration of a travelling wave combine type high frequency power amplifier equivalent to another embodiment of the invention. This embodiment is different from the embodiment shown in FIG. 5 in that a low frequency rejection filter composed of capacitors 31a1 to 31an, inductors 31b1 to 31bn and resistors 31c1 to 31cn is provided on the output side of power amplifiers 13a1 to 13an.

In this embodiment, the low frequency rejection filter can also prevent loop oscillation by the parallel resonance of the capacitors 31a1 to 31an and the inductors 31b1 to 31bn and can also prevent self oscillation by the resistors 31c1 to 31cn. Therefore, this embodiment has the effect that the breakdown of a semiconductor device by the oscillation is prevented. As in the embodiment described above, the low frequency rejection filer can also function as a matching circuit.

Sixth Embodiment

Figure 8:
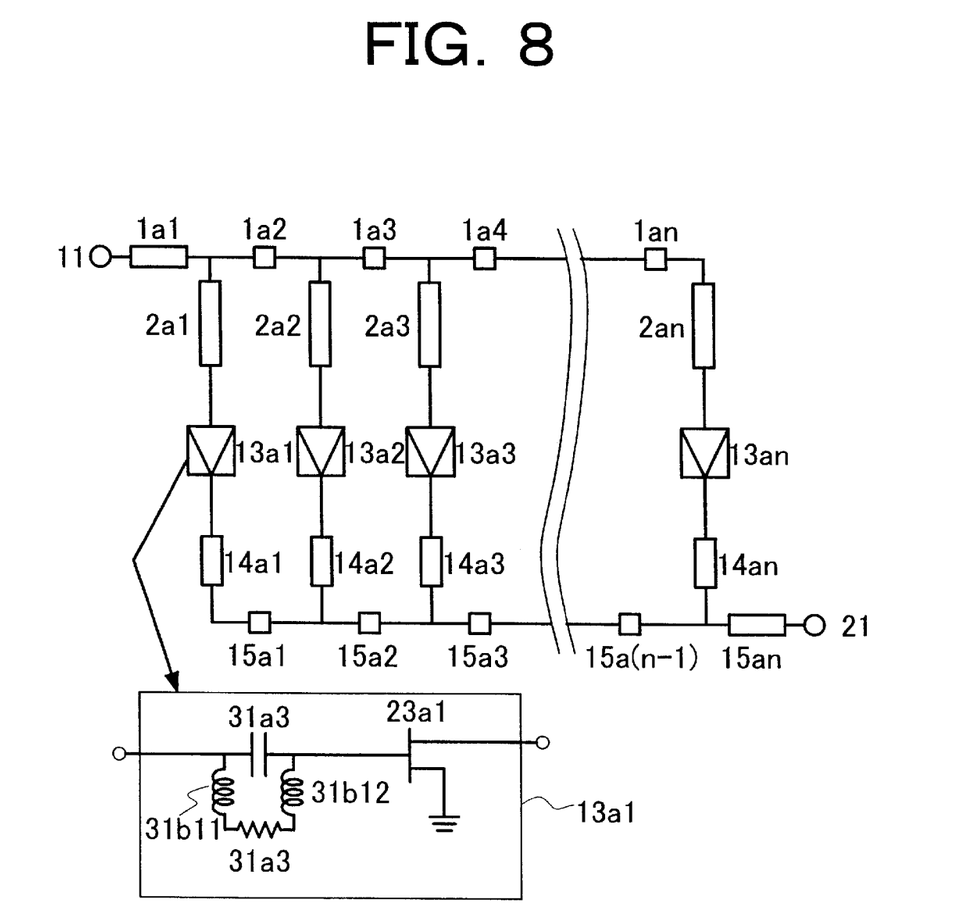
FIG. 8 is a block diagram showing further another embodiment of the travelling wave combine type high frequency power amplifier according to the invention.

FIG. 8 is a block diagram showing the configuration of a travelling wave combine type high frequency power amplifier equivalent to another embodiment of the invention. This embodiment is different from the embodiment shown in FIG. 5 in that a low frequency rejection filter is provided on each input side of semiconductor devices used for power amplifiers 13a1 and 13an with the low frequency rejection filer integrated into a monolithic integrated circuit.

That is, as the configuration of the power amplifier 13a1 is shown in a box shown by an arrow for an example, the low frequency rejection filter composed of a capacitor 31a3, two inductors 31b11 and 31b12 and a resistor 31c3 is provided on the input side of a semiconductor device 23a1 with the low frequency rejection filter integrated into the monolithic integrated circuit. The power amplifiers 13a2 to 13an also have the similar configuration to that of the power amplifier 13a1 though the configuration of the power amplifiers 13a2 to 13an is not shown in FIG. 8. The reason why two inductors are provided is to prevent self oscillation and to effectively reduce the occupied area on a chip because the occupied area is increased and self oscillation is easily caused by the increase of the parasitic resistance of an inductor itself and parasitic capacitance between metal layers when one large inductor is formed in case the inductor the metal layer of which has a spiral pattern is formed on a semiconductor substrate.

According to this embodiment, each low frequency rejection filter monolithically integrated with semiconductor devices 23a1 to 23an prevents loop oscillation by the parallel resonance of capacitors 31a1 to 31an and inductors 31b1 to 31bn as in the embodiments shown in FIGS. 5 and 7 and prevents self oscillation by resistors 31c1 to 31cn. It need scarcely be said that even if the inductor of the low frequency rejection filter is formed by one inductor as in each embodiment in a range in which self oscillation by the parasitic resistance and the parasitic capacitance of the inductor itself is not caused, there is the effect of preventing the oscillation.

Seventh Embodiment

Figure 9:
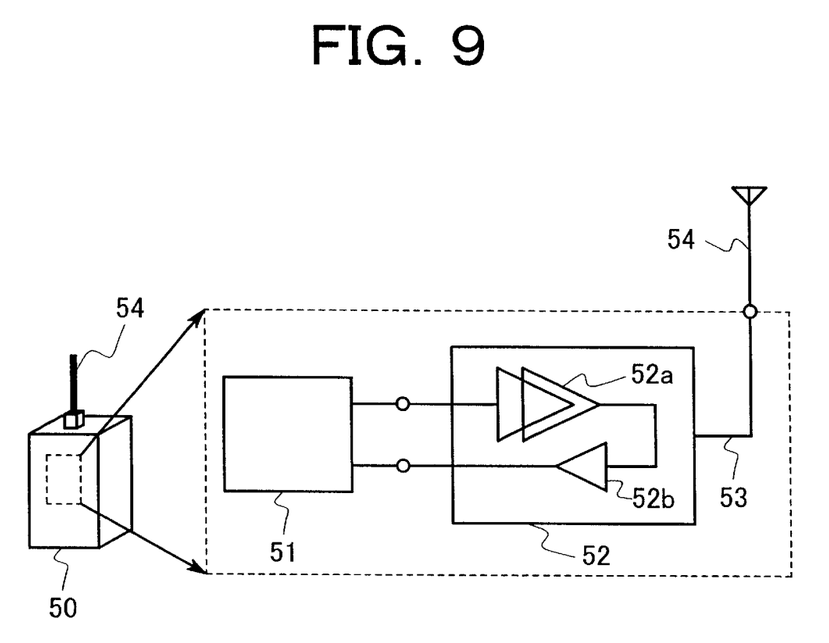
FIG. 9 is an explanatory drawing showing the configuration of a mobile communication base station to which the travelling wave combine type high frequency power amplifier according to the invention is applied.

FIG. 9 is an explanatory drawing showing the configuration of a mobile communication base station. As shown in FIG. 9, a reference number 50 denotes abase station and in this base station 50, a signal supplied from a base band signal processing unit (not shown) is converted to a frequency (a carrier frequency) which can be propagated in space as a radio wave by a modulation/demodulation unit 51. A transceive signal amplifier unit 52 amplifies the power of a transceive signal to make the radio wave reach a mobile terminal such as a mobile telephone (at the transmitting end) or to extract a feeble signal transmitted from the terminal (at the receive end). In the transceive signal amplifier unit 52, transmission power is amplified by a linearizing power amplifier 52a in the transceive signal amplifier unit 52 and a received signal is amplified by a lower noise amplifier 52b. A transmitted signal the power of which is amplified is output from an antenna 54 as a radio wave via a high frequency cable 53.

Figure 10:
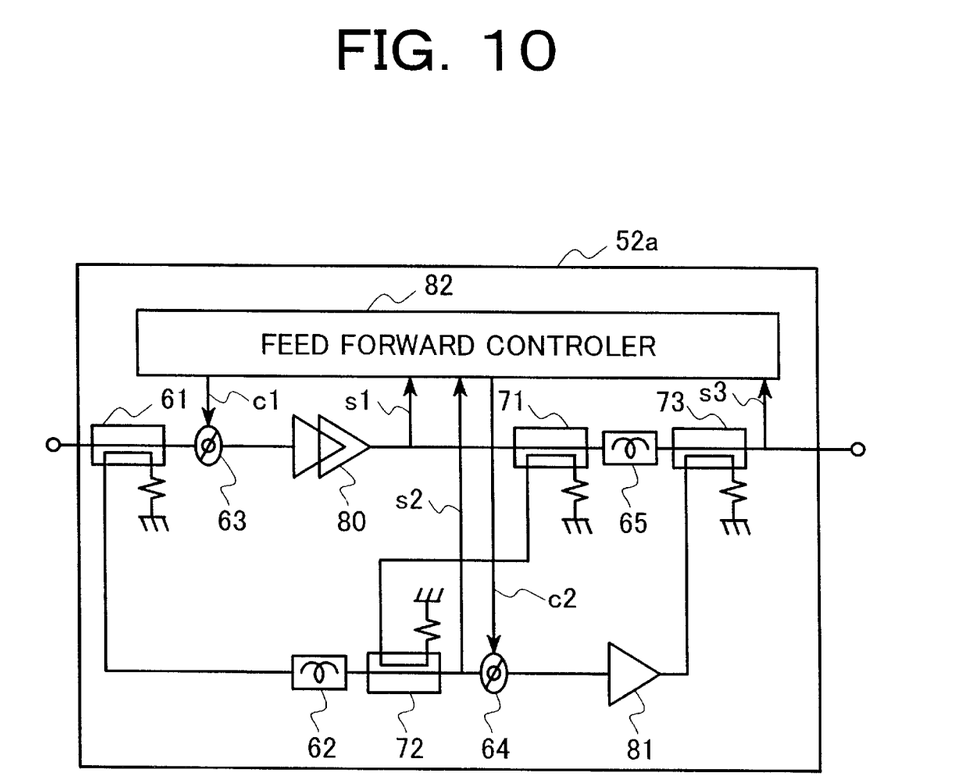
FIG. 10 is a circuit diagram showing an example of the configuration of a feed forward power amplifier used in a transceive signal amplifier unit of the base station shown in FIG. 9.

FIG. 10 shows an example of the configuration of a feed forward power amplifier as a typical linearizing power amplifier 52a used in the transceive signal amplifier unit 52. After amplification by a main power amplifier 80, a main signal divided by a divide circuit 71 and a main signal before the amplification via a delay line 62 the signal delay of which is equivalent to signal delay in the main power amplifier 80 and which is divided by a divide circuit 61 are combined by a combine circuit 72.

Hereby, an error signal (signal distortion) caused by the amplification of the main signal is extracted (by an error signal educe circuit). The educed error signal is amplified by an error signal power amplifier 81 via a variable phase shifter 64 and distortion is eliminated from the amplified main signal (by a distortion eliminating circuit) by combining the amplified error signal with the main signal via a delay line 65 the delay of which is equivalent to delay in the error signal power amplifier by a combine circuit 73. A feed forward controller 82 monitors the power and controls variable phase shifters 63 and 64 to optimize the elimination of distortion. Reference codes c1 and c2 denote a control signal and s1, s2 and s3 denote a detection signal.

Generally, as the linearity of the current power amplifier is not enough, the main power amplifier 80 the output of which is large is inserted into the linearizing power amplifier 52a to secure the linearity of power amplification required for the system. As described above, power which can be output by one semiconductor device used for the power amplifier is small and the output is combined using plural amplifiers composed of each semiconductor device.

Therefore, in the base station 50, loop oscillation and self oscillation are prevented by using the high frequency power amplifier provided with the low frequency rejection filter according to the invention equivalent to any of the first to sixth embodiments for the main power amplifier 80 included in the linearizing power amplifier 52a in the transceive signal amplifier unit 52, and a super power compact transmission power amplifier the linearity of which is satisfactory and the efficiency of which is high can be realized. As oscillation and others due to load fluctuation are not caused by using the high frequency power amplifier according to the invention, an isolator and others used at the output end of the high frequency power amplifier are not required to be used. Therefore, the high frequency power amplifier is also effective to enhance the efficiency of the whole base station.

The preferred embodiments of the invention have been described above, however, the invention is not limited to the embodiments and it is natural that various design changes are possible in a range in which they do not deviate from the spirit of the invention.

Figure 11A:
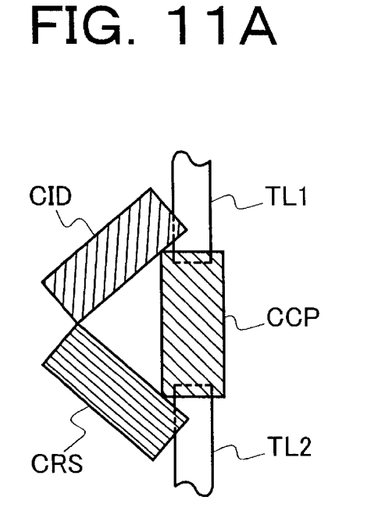
FIGS. 11A and 11B are respectively a layout drawing schematically showing chip components composing the low frequency rejection filter.
Figure 11B:
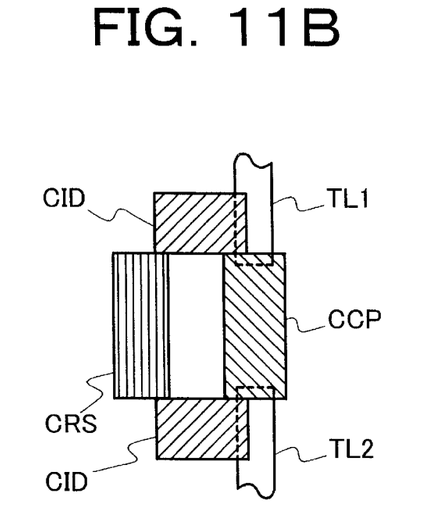

For example, in the low frequency rejection filters shown in FIGS. 5, 7 and 12, the circuit composed of one capacitor, one resistor and one inductor is shown, however, in that case, as only the layout is schematically shown in FIG. 11A, a chip capacitor CCP, a chip inductor CID and a chip resistor CRS are connected between transmission lines TL1 and TL2. However, as in the embodiment shown in FIG. 8, the low frequency rejection filter may be also composed of the capacitor, the resistor and the two inductors. In that case, as only the layout is schematically shown in FIG. 11B, as the chips can be arranged and connected only longitudinally and laterally, that is, in only XY directions, an automatic soldering apparatus can be used in addition to the effect of oscillation prevention and the configuration has an effect upon the reduction of the cost.

As clear from each embodiment described above, according to the invention, in case in the high frequency power amplifier, plural power combiners are used for tournament connection, the problem of loop oscillation at a low frequency caused by a closed loop formed between combined semiconductor devices and the problem of self oscillation caused by impedance applied to the input and the output of the semiconductor device can be solved without requiring large occupied area. Therefore, there is the effect of preventing the breakdown of the semiconductor device used in the travelling wave combine type high frequency power amplifier.

Also, in case the high frequency power amplifier according to the invention is used in the mobile communication base station, a compact and efficient transmission power amplifier which is suitable for a digital communication system and the linearity of which is satisfactory can be realized.

What is claimed is:

1. A high frequency power amplifier using a travelling wave combine and divide circuit, wherein:
    at least one oscillation prevention circuit provided with a function for preventing loop oscillation and self oscillation is provided to all closed loops composed via the travelling wave combine and divide circuit,
    said oscillation prevention circuit is formed by a low frequency rejection filter provided with a passing attenuate characteristic having two troughs in which a passing attenuate value respectively increases at a loop oscillation frequency and a self oscillation frequency, and said low frequency rejection filter connects a capacitor inserted into each high frequency signal line divided using a travelling wave divide circuit in series and a series circuit parallel with the capacitor and composed of an inductor and a resistor.

2. A high frequency power amplifier according to claim 1, wherein:

a frequency of parallel resonance by a capacitor and an inductor composing said low frequency rejection filter is set to a frequency at which the loop oscillation of a closed loop formed via said travelling wave combine and divide circuit may occur; and the impedance of a series circuit composed of the inductor and a resistor respectively provided in parallel with the capacitor is set so that it is close to pure resistance.

3. A high frequency power amplifier, wherein:

the low frequency rejection filter according to claim 1 also functions as an internal matching circuit of a device.

4. A high frequency power amplifier, wherein:

the low frequency rejection filter according to claim 2 also functions as an internal matching circuit of a device.

5. A mobile communication base station provided with a transceive signal amplifier unit provided with a modulation/demodulation unit that converts a signal supplied from a base band signal processing unit to a carrier frequency, a transceive signal amplifier unit provided with a linearizing power amplifier that amplifies transmission power and a low noise amplifier that amplifies a received signal and an antenna that radiates a transmitted signal the power of which is amplified and which is transmitted via a high frequency cable as a radio wave, wherein:

the linearizing power amplifier is formed by a feed forward power amplifier; and the high frequency power amplifier according to claim 1 used for a main power amplifier in the feed forward power amplifier.

6. A mobile communication base station according to claim 5, wherein:

a frequency of parallel resonance by a capacitor and an inductor composing said low frequency rejection filter is set to a frequency at which the loop oscillation of a closed loop formed via said travelling wave combine and divide circuit may occur; and the impedance of a series circuit provided in parallel with the capacitor and composed of an inductor and a resistor is set so that it is close to pure resistance.

7. A mobile communication base station, wherein:

the low frequency rejection filter according to claim 5 also functions as an internal matching circuit of a device.

8. A mobile communication base station, wherein:

the low frequency rejection filter according to claim 6 also functions as an internal matching circuit of a device.

9. A high frequency power amplifier using a travelling wave combine and divide circuit, wherein:

at least one oscillation prevention circuit provided with a function for preventing loop oscillation and self oscillation is provided to all closed loops composed via the travelling wave combine and divide circuit, said oscillation prevention circuit is formed by a low frequency rejection filter provided with a passing attenuate characteristic having two troughs in which a passing attenuate value respectively increases at a loop oscillation frequency and a self oscillation frequency, and said low frequency rejection filter connects a capacitor inserted into each high frequency signal line divided using a travelling wave divide circuit in series and a series circuit parallel with the capacitor and composed of an inductor, a resistor and an inductor.

10. A high frequency power amplifier according to claim 9, wherein:

a frequency of parallel resonance by a capacitor and an inductor composing said low frequency rejection filter is set to a frequency at which the loop oscillation of a closed loop formed via said travelling wave combine and divide circuit may occur; and the impedance of a series circuit composed of the inductor and a resistor respectively provided in parallel with the capacitor is set so that it is close to pure resistance.

11. A high frequency power amplifier, wherein:

the low frequency rejection filter according to claim 9 also functions as an internal matching circuit of a device.

12. A high frequency power amplifier, wherein:

the low frequency rejection filter according to claim 10 also functions as an internal matching circuit of a device.

13. A mobile communication base station provided with a transceive signal amplifier unit provided with a modulation/demodulation unit that converts a signal supplied from a base band signal processing unit to a carrier frequency, a transceive signal amplifier unit provided with a linearizing power amplifier that amplifies transmission power and a low noise amplifier that amplifies a received signal and an antenna that radiates a transmitted signal the power of which is amplified and which is transmitted via a high frequency cable as a radio wave, wherein:

the linearizing power amplifier is formed by a feed forward power amplifier; and the high frequency power amplifier according to claim 9 used for a main power amplifier in the feed forward power amplifier.

14. A mobile communication base station according to claim 13, wherein:

a frequency of parallel resonance by a capacitor and an inductor composing said low frequency rejection filter is set to a frequency at which the loop oscillation of a closed loop formed via said travelling wave combine and divide circuit may occur; and the impedance of a series circuit provided in parallel with the capacitor and composed of an inductor and a resistor is set so that it is close to pure resistance.

15. A mobile communication base station, wherein:

the low frequency rejection filter according to claim 13 also functions as an internal matching circuit of a device.

16. A mobile communication base station, wherein:

the low frequency rejection filter according to claim 14 also functions as an internal matching circuit of a device.

* * * * *